(12) United States Patent
Tanikawa

(10) Patent No.: US 8,565,028 B2
(45) Date of Patent: Oct. 22, 2013

(54) SEMICONDUCTOR NONVOLATILE MEMORY DEVICE

(75) Inventor: Hiroyuki Tanikawa, Tokyo (JP)

(73) Assignee: Lapis Semiconductor Co., Ltd. (JP)

( * ) Notice: Subject to any disclaimer, the term of this patent is extended or adjusted under 35 U.S.C. 154(b) by 111 days.

(21) Appl. No.: 13/093,467

(22) Filed: Apr. 25, 2011

(65) Prior Publication Data

US 2011/0261627 A1 Oct. 27, 2011

(30) Foreign Application Priority Data

Apr. 27, 2010 (JP) ................................. 2010-102106

(51) Int. Cl.
*G11C 7/14* (2006.01)
(52) U.S. Cl.
USPC ....................................... 365/189.09; 365/96
(58) Field of Classification Search
USPC ........... 365/96, 189.05, 189.09, 185.2, 210.1, 365/210.15
See application file for complete search history.

(56) References Cited

U.S. PATENT DOCUMENTS

| 7,277,324 | B2 | 10/2007 | Tomita |
| 8,289,778 | B2 | 10/2012 | Soma |
| 2005/0082579 | A1* | 4/2005 | Horii et al. ..................... 257/222 |
| 2006/0203560 | A1 | 9/2006 | Tomita |
| 2007/0080739 | A1* | 4/2007 | Taki et al. ..................... 327/525 |
| 2008/0043537 | A1* | 2/2008 | Tanikawa et al. ........ 365/185.23 |
| 2009/0323440 | A1 | 12/2009 | Soma |

FOREIGN PATENT DOCUMENTS

| JP | 11-017010 | 1/1999 |
| JP | 2006-252670 A | 9/2006 |
| JP | 2009-080872 A | 4/2009 |
| JP | 2010-009728 A | 1/2010 |

OTHER PUBLICATIONS

Japanese Office Action; JP2010-102106; Sep. 3, 2013.

* cited by examiner

*Primary Examiner* — Douglas King
(74) *Attorney, Agent, or Firm* — Studebaker & Brackett PC

(57) ABSTRACT

In a semiconductor nonvolatile memory device, nonvolatile memory cells are plurally arranged in a memory array portion. An output circuit outputs setting information selected from plural sets of setting information to generate reference currents with different current values. A reference current circuit generates a reference current with a current value according to the setting information outputted from the output circuit. An amplifier circuit compares a cell current outputted from a selected memory cell of the memory array portion with the reference current generated by the reference current circuit.

14 Claims, 13 Drawing Sheets

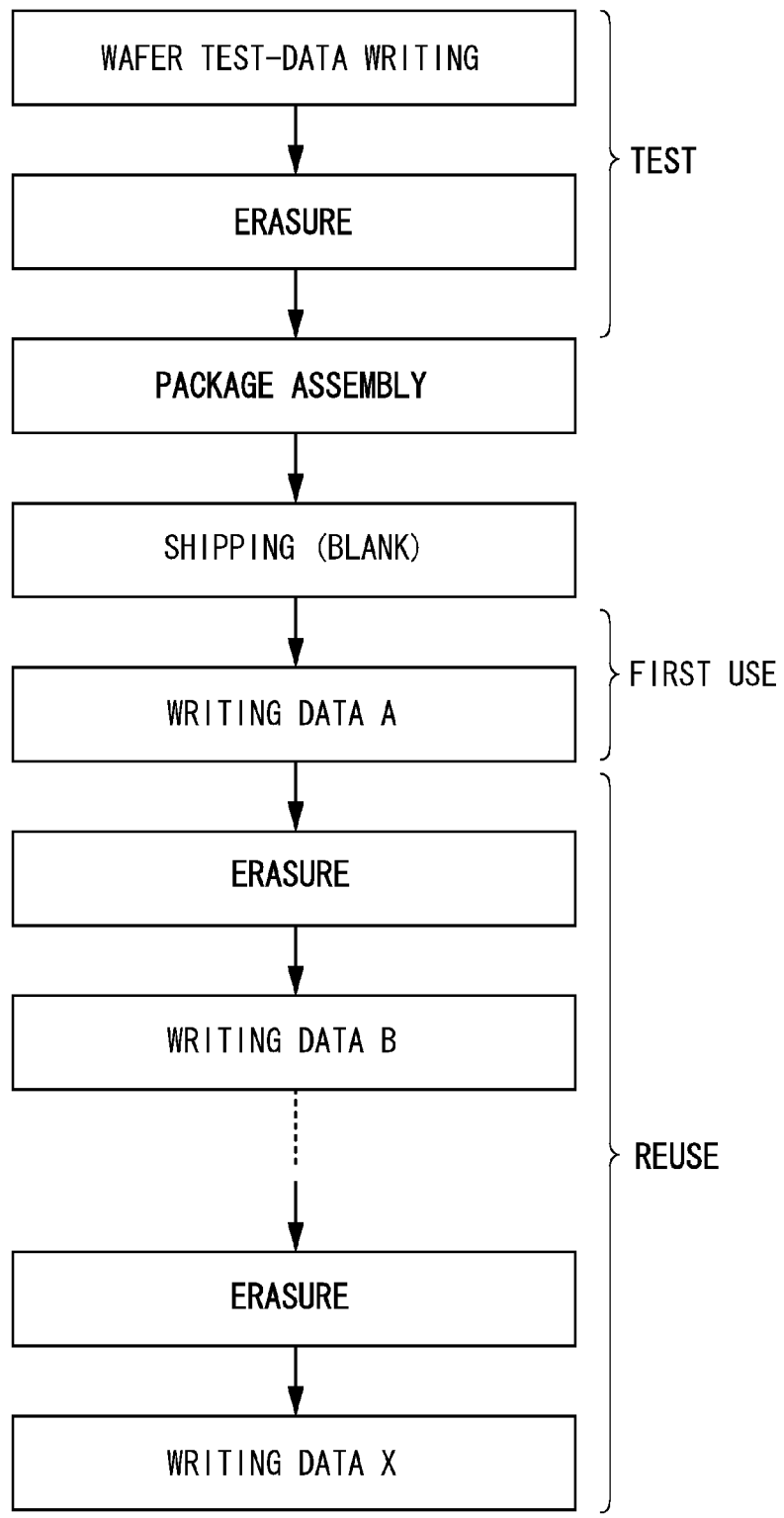

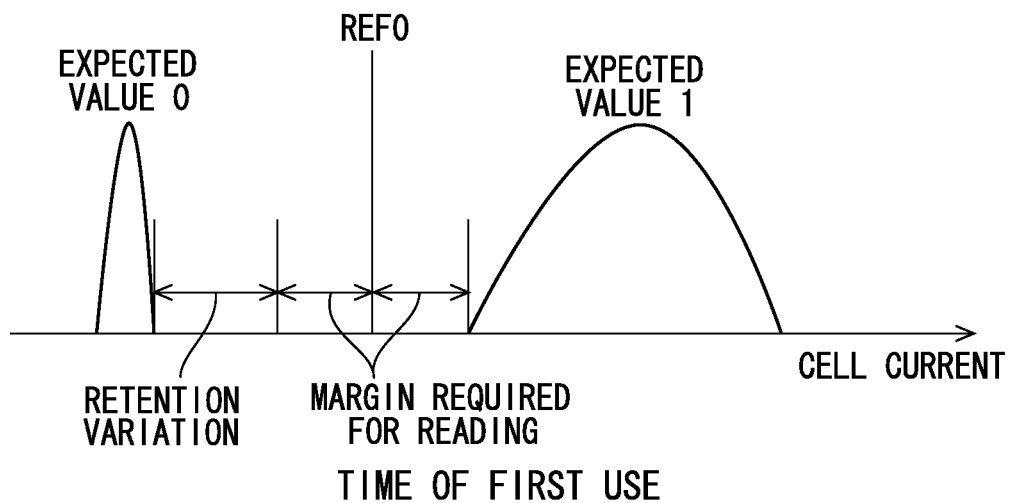
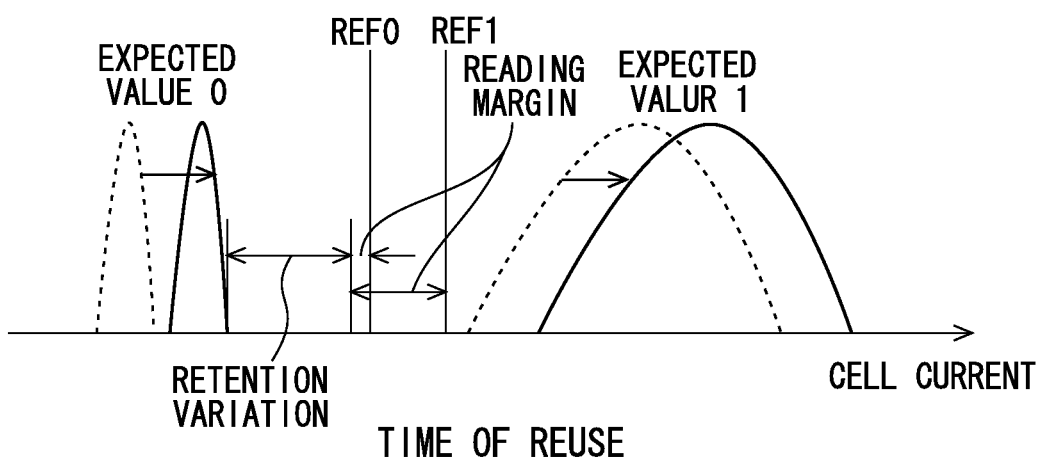

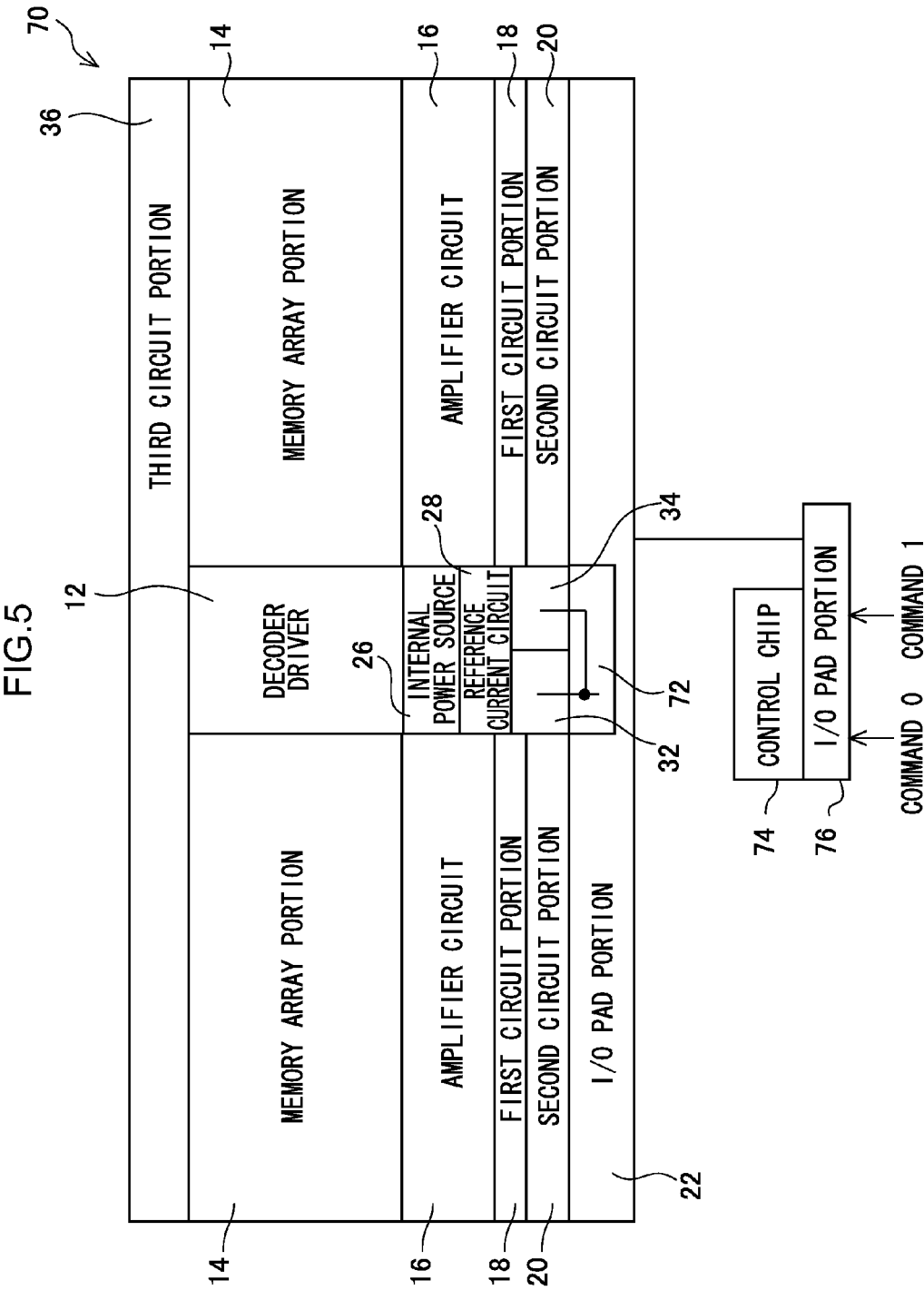

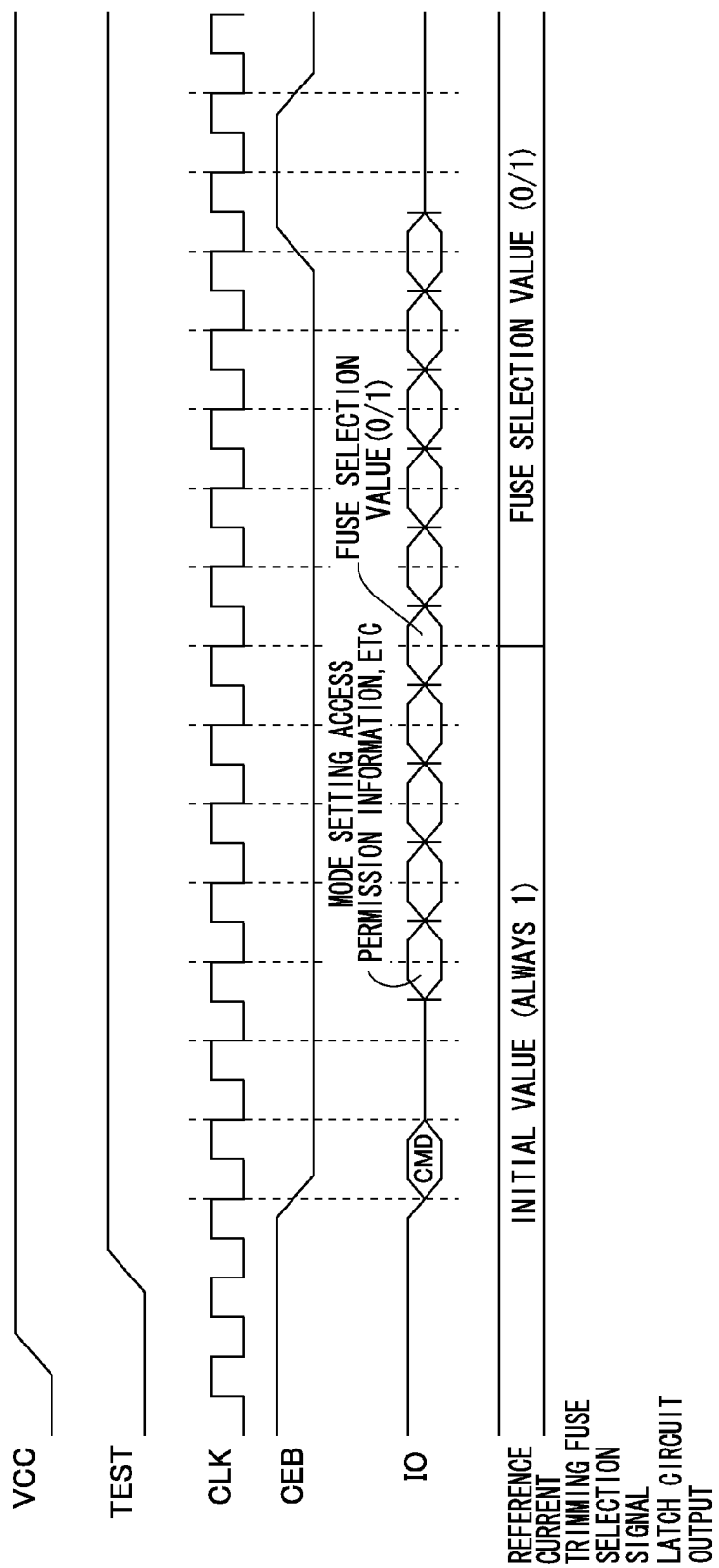

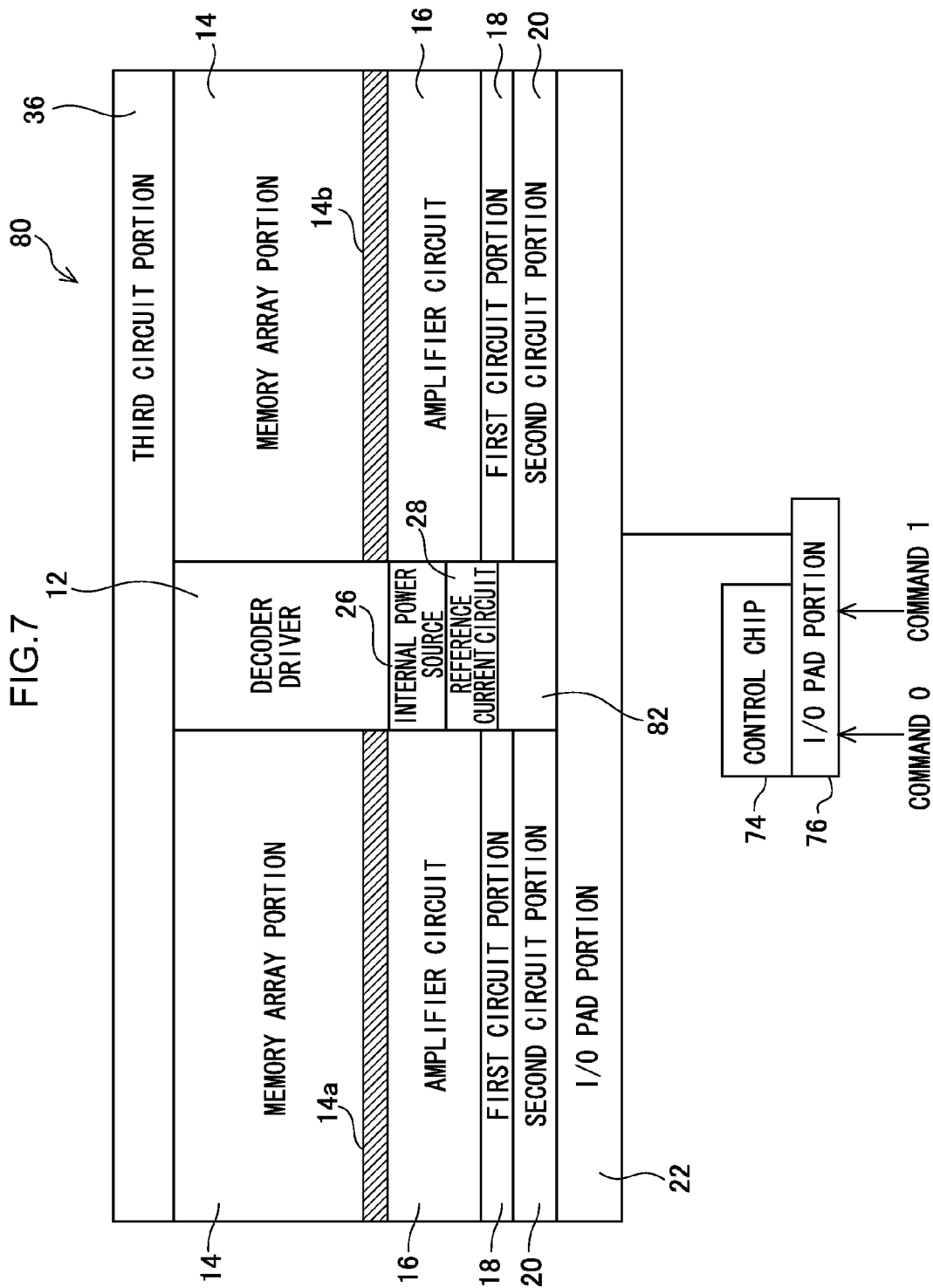

▨ CHARGE ACCUMULATION PORTION

SEMICONDUCTOR NONVOLATILE MEMORY DEVICE

CROSS-REFERENCE TO RELATED APPLICATION

This application claims priority under 35 USC 119 from Japanese Patent Application No. 2010-102106 filed on Apr. 27, 2010, the disclosure of which is incorporated by reference herein.

BACKGROUND OF THE INVENTION

1. Field of the Invention

The present invention relates to a reusable semiconductor nonvolatile memory device, and more particularly to setting current values of a reference current.

2. Description of the Related Art

Semiconductor nonvolatile memory devices (hereinafter referred to as semiconductor memories) are widely used as memories for portable devices and the like, because nonvolatile memories do not need electric power to retain memorized information. In recent years, as memory cells have been miniaturized, optimum control of writing and reading conditions of the memory cells has become very important for improving reliability, productivity and the like of memories. Optimum control is realized by storing trimming information, which designates supply voltages and supply currents for incorporated circuits, on a memory chip in advance and referring to the trimming information during memory operations. As a method for storing trimming information, laser fuse trimming, as disclosed in Japanese Patent Application Laid-Open (JP-A) No. 11-17010, is commonly implemented. In this method, fuse elements are used for storing the information. Specifically, fuses are selectively cut in a wafer test process and, during operations of that memory, logical signals of 0 and 1, depending on whether or not each fuse is cut, are generated to serve as the information.

A technique for making this kind of nonvolatile memory reusable (which may hereinafter referred to as reuse) is disclosed in JP-A No. 2009-80872. In this technique, a nonvolatile memory that cannot be rewritten electronically is divided into a plural number of blocks, and the nonvolatile memory is reused by the blocks being expendably used.

The technique described in JP-A No. 2009-80872 expends the blocks. Therefore, the memory capacity is reduced with each reuse.

There is a reuse method in which data written to a nonvolatile memory is deleted. However, in the device mentioned above in which fuse elements are cut to store trimming information, conditions necessary for reading at a time of reuse may be shifted from the conditions specified by the trimming information that was stored in the fuse elements at the time of the wafer test, and the nonvolatile memory may become unreadable. This point is discussed below.

Heretofore, trimming information has been stored (for example, fuse elements are cut) at the time of a wafer test that is performed before shipping of the nonvolatile memory (see FIG. 3). Thus, a current value REF0 of a reference current (hereinafter referred to as the reference current) that is to be compared with cell currents from memory cells when data is being read from the nonvolatile memory is specified. The current value REF0 is determined by estimating a variation of retention (charge retention), from memory cell characteristics when the memory cells are first used (at a first time of use after shipping), and distributions of expected value 0 and expected value 1 after writing, taking account of a margin required for reading (see FIG. 12A).

When the memory is reused after the first use, the distributions of expected value 0 and expected value 1 after writing may be shifted from the time of first use, even if the cells are written under the same conditions as at the time of first use, because, for example, electrons and holes may not be properly neutralized or the like. Consequently, the margin required for reading may not be assured with a reference current of the current value REF0 that was specified by cutting the fuse elements. Therefore, reading reliability falls.

Now a principal reason that the margin required for reading may not be assured is described in detail. When a nonvolatile memory in which electrons have been injected and data has been written at the time of first use is to be reused, firstly, holes are injected and charge is neutralized to erase the written data. After the holes are injected, the nonvolatile memory may be heated (burning) in order to promote charge neutralization and improve retention. Charge neutralization is promoted if the memory is burned at a higher temperature, but after package assembly the burning may not be performed at a high temperature. Therefore, the burning is performed at a low temperature to neutralize the charges. A long duration of burning is required with a low temperature, and if the duration of burning is shortened, the electrons may not be properly erased. In these circumstances, the distributions of expected value 0 and expected value 1 when the memory is reused are shifted from the time of first use.

The variation of retention also changes rather than being constant. Thus, when memory cells are reused, the memory cell characteristics may not completely return to their original state and the situation described above may arise. With nonvolatile memories such as flash memories and the like, a process such as burning or the like is not carried out. Even so, memory cell characteristics may change with repeated writing and erasure and the situation described above may arise.

In nonvolatile memories, there are memory cells in which charge accumulation portions are provided at portions below gates as illustrated in FIG. 13A, and there are memory cells in which charge accumulation portions are provided at the sides of gates as illustrated in FIG. 13B and FIG. 13C. In a semiconductor nonvolatile memory of a side type in which the charge accumulation portion is provided at the side(s) of the gate, neutralizing charge is more difficult, and electrons are likely to remain even after erasure processing is carried out. Therefore, the situation described above is particularly likely to arise in side-type nonvolatile memories.

In the above descriptions, descriptions are given comparing a time of first use with a time of reuse, but this is not a limiting example. For example, an amount of shifting may be within a tolerance range and the margin required for reading may be assured up to a plural number of reuses from the first use, while thereafter the amount of shifting may exceed the tolerance range and the margin required for reading may not be assured.

SUMMARY OF THE INVENTION

The present invention has been made in view of the above circumstances and provides semiconductor nonvolatile memory device.

According to a first aspect of the present invention, there is provided a semiconductor nonvolatile memory device including: a memory array portion in which nonvolatile memory cells are plurally arranged; an output circuit that outputs setting information selected from a plurality of sets of setting information to generate reference currents with different current values; a reference current circuit that generates a reference current with a current value according to the setting information outputted from the output circuit; and an amplifier circuit that compares a cell current outputted from a selected memory cell of the memory array portion with the reference current generated by the reference current circuit.

BRIEF DESCRIPTION OF THE DRAWINGS

Preferred embodiments of the present invention will be described in detail based on the following figures, wherein:

FIG. 3 is a diagram illustrating an example of reuse flow of the semiconductor nonvolatile memory device.

FIG. 4A and FIG. 4B are explanatory diagrams describing changes in characteristics of a memory cell when first used and when reused, and reference current setting states.

FIG. 5 is an overall structural diagram of a semiconductor nonvolatile memory device of a second exemplary embodiment.

FIG. 6 is a diagram illustrating a timing chart of signals generated when a selection signal is latched into a reference current trimming fuse selection value latch circuit of the second exemplary embodiment.

FIG. 7 is an overall structural diagram of a semiconductor nonvolatile memory device of a third exemplary embodiment.

FIG. 11 is a diagram illustrating a timing chart of signals when a power source of the memory chip of the fourth exemplary embodiment is turned on.

DETAILED DESCRIPTION OF THE INVENTION

Herebelow, exemplary embodiments are described in detail with reference to the attached drawings.

First Exemplary Embodiment

Figure 1:
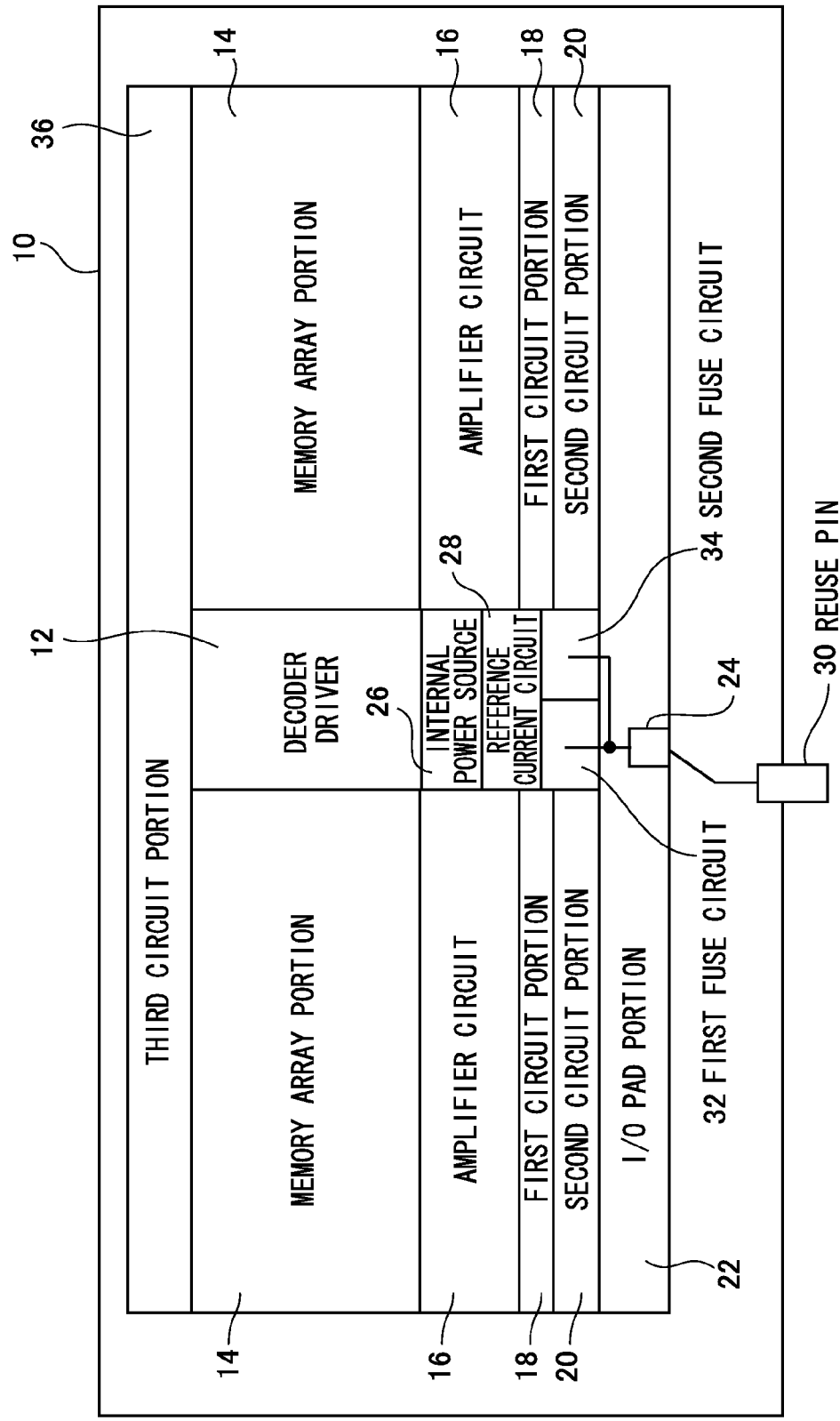
FIG. 1 is an overall structural diagram of a memory chip that serves as a semiconductor nonvolatile memory device of a first exemplary embodiment.
Figure 2:
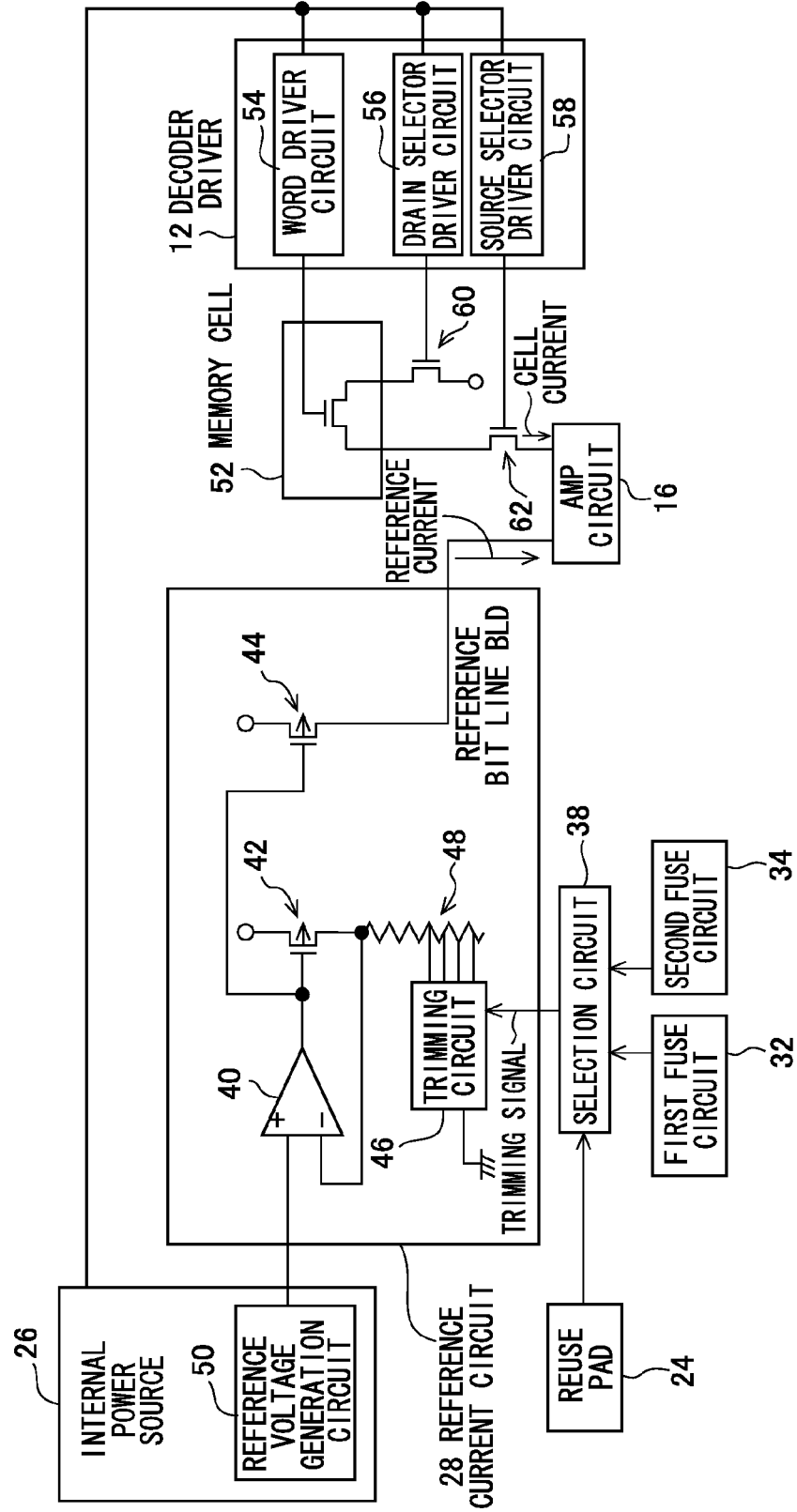
FIG. 2 is diagram illustrating structure of a reference current circuit included in the memory chip and illustrating connection relationships between the reference current circuit and other structural elements that are peripheral to the reference current circuit.

FIG. 1 is an overall structural diagram of a memory chip 10 that serves as a semiconductor nonvolatile memory device of the present exemplary embodiment. FIG. 2 is a diagram illustrating structure of a reference current circuit (hereinafter referred to as a REF current circuit) 28 included in the memory chip 10, and illustrating connection relationships between the reference current circuit 28 and other structural elements that are peripheral to the reference current circuit 28.

A decoder driver 12 that drives a memory array portion 14 is provided in the memory chip 10. As illustrated in FIG. 2, the decoder driver 12 is provided with a word driver circuit 54, a drain selector driver circuit 56 and a source selector driver circuit 58. As illustrated in FIG. 1, the memory array portion 14 is provided at both sides of the decoder driver 12, and numerous memory cells 52 are arranged in matrixes in the memory array portions 14.

Figure 13A:
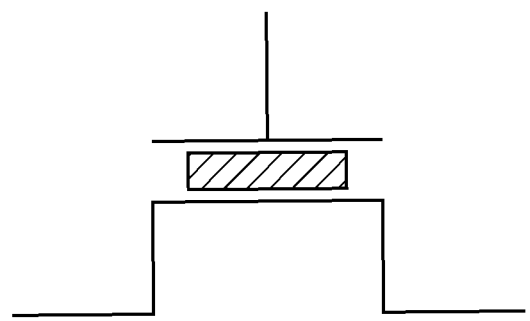
FIG. 13A is a diagram schematically illustrating a memory cell in which a charge accumulation portion is provided below a gate.
Figure 13B:
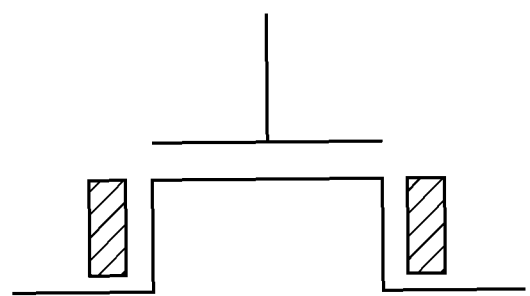
FIG. 13B is a diagram schematically illustrating a memory cell in which charge accumulation portions are provided at both sides of a gate.
Figure 13C:
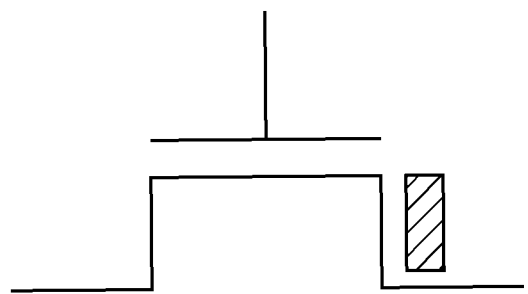
FIG. 13C is a diagram schematically illustrating a memory cell in which a charge accumulation portion is provided at one side of a gate.

The memory cells 52 constituting the memory array portions 14 of the present exemplary embodiment are formed of MOS transistors, in each of which charges may be accumulated in charge accumulation portions by an electronic process and the charge accumulation portions are included at both sides of the gate (see FIG. 13B). The gates of the memory cells 52 are connected to the word driver circuit 54 via word lines. The drains and sources of the memory cells 52 are respectively connected to pairs of bit lines. The drains of the memory cells 52 are connected to drain selection transistors 60, which are provided on the bit lines, and a predetermined voltage is applied to the gates of the drain selection transistors from the drain selector driver circuit 56. The sources of the memory cells 52 are connected to source selection transistors 62 provided on the bit lines, and a predetermined voltage is applied to the gates of the source selection transistors from the source selector driver circuit 58.

In the memory chip 10, amplifier circuits 16, first circuit portions 18 and second circuit portions 20 are provided in respective correspondence with the memory array portions 14.

Each amplifier circuit 16 is a circuit that compares a cell current outputted by a selected memory cell 52 of the memory array portion 14 with a reference current inputted from the reference current circuit 28 (hereinafter referred to as the REF current), and amplifies and outputs a difference between the cell current and the reference current.

Each first circuit portion 18 is provided with a bit line relief circuit and a logic circuit. The bit line relief circuit is a circuit for relieving bit lines that include failed memory cells in the corresponding memory array portion 14. The logic circuit is an adjustment circuit for adjusting data outputs.

Each second circuit portion 20 is provided with a data latch circuit, an error correction circuit (ECC) and a logic circuit. The data latch circuit latches output signals outputted from the amplifier circuit 16. The ECC corrects errors in the data latched by the data latch circuit. The logic circuit is an adjustment circuit for adjusting outputs of the data that has been error-corrected by the ECC.

An I/O pad portion 22, an internal power source 26, the reference current circuit 28, a first fuse circuit 32, a second fuse circuit 34 and a third circuit portion 36 are also provided in the memory chip 10.

The I/O pad portion 22 is a terminal portion at which data read from the respective memory array portions 14 is outputted to outside the memory chip 10 and data to be written to the memory array portions 14 is inputted. In addition to the reading data and writing data, a variety of signals are inputted and outputted through the I/O pad portion 22. In this I/O pad portion 22, a reuse pad 24 is provided. Of a plural number of pins equipped to the memory chip 10, this reuse pad 24 is connected to a reuse pin 30 that is for inputting a selection signal for selecting one or other of the first fuse circuit 32 and the second fuse circuit 34, which are described below.

The internal power source 26 supplies power to the decoder driver 12, the reference current circuit 28, the third circuit portion 36 and the like.

The third circuit portion 36 is provided with a writing circuit and a word line relief circuit. The writing circuit is a circuit for writing to the memory array portions 14. The writing circuit latches writing data inputted through the I/O pad portion 22, applies predetermined voltages to the memory cells 52 of the memory array portions 14, and performs writing. More specifically, writing is implemented by controlling the voltages of the word lines and selectively accumulating charges in the charge accumulation portions of the memory cells 52 via the bit lines. Once charges are accumulated, the charges are retained until erased, even if the power source is cut off. When the memory chip 10 is to be reused, a process is carried out to erase the charges accumulated in the charge accumulation portions, and then writing is performed again.

In the present exemplary embodiment, writing is performed by selectively applying a voltage to the charge accumulation portions of the memory cells 52 and injecting electrons therein. Accordingly, erasure processing is implemented by neutralizing the electrons that are injected at the time of writing, by injecting holes and performing burning for a pre-specified duration at a pre-specified temperature, or the like.

The word line relief circuit is a circuit for relieving word lines that include failed memory cells in the corresponding memory array portions 14.

The first fuse circuit 32 and the second fuse circuit 34 are circuits that respectively contain fuse elements, and that respectively store trimming information from beforehand.

Specifically, before shipping of the memory chip 10, a current value (a first current value REF0) of the reference current for the time of first use (the time of first use after shipping) is determined in advance in accordance with memory cell characteristics for the time of first use, and a current value (a second current value REF1) of the reference current for subsequent times of reuse (times of use from the second use after shipping) is determined in advance in accordance with memory cell characteristics for times of reuse.

Then, at the time of a wafer test before shipping (see FIG. 3), first trimming information is stored in the first fuse circuit 32 by fuse elements of the first fuse circuit 32 being cut by a laser. The first trimming information is for specifying the current value of the reference current that is generated by the reference current circuit 28 as the first current value REF0. In addition, second trimming information is stored in the second fuse circuit 34 by fuse elements of the second fuse circuit 34 being cut by a laser. The second trimming information is for specifying the current value of the reference current that is generated by the reference current circuit 28 as the second current value REF1.

Now, detailed structure of the reference current circuit 28 is described with reference to FIG. 2.

The reference current circuit 28 is provided with an operational amplifier 40, a first current source 42, a second current source 44, a trimming circuit 46 and a resistance division circuit 48.

The output terminal of the operational amplifier 40 is connected to the first current source 42. A reference voltage generation circuit 50, which is provided at the internal power source 26, is connected to the non-inverting (+) input terminal of the operational amplifier 40, and a reference voltage generated by the reference voltage generation circuit 50 is applied to the non-inverting (+) input terminal.

The resistance division circuit 48 is constituted with a plural number of resistors connected in series, and a resistance value thereof is adjusted by control by the trimming circuit 46. A voltage at the inverting (−) input terminal of the operational amplifier 40 is adjusted in accordance with the resistance voltage of the resistance division circuit 48.

With this structure, a current value that flows from the first current source 42 is set in accordance with the resistance value of the resistance division circuit 48. The first current source 42 and the second current source 44 are connected in a current mirror arrangement. Thus, a reference current in accordance with the current flowing from the first current source 42 flows from the second current source 44 into a reference bit line D. The reference bit line D is connected to the amplifier circuits 16. Thus, the reference current supplied through the reference bit line D and cell currents supplied from the memory cells 52 are inputted into the amplifier circuits 16.

The trimming circuit 46 is connected to a selection circuit 38 (not shown in FIG. 1), and adjusts the resistance value of the resistance division circuit 48 in accordance with a trimming signal outputted from the selection circuit 38.

The selection circuit 38 is connected to the reuse pad 24, the first fuse circuit 32 and the second fuse circuit 34. A user controls the selection circuit 38, via the reuse pad 24 connected to the reuse pin 30, by inputting a first selection signal (for example, a low-level signal) through the reuse pin 30 at the time of first use and inputting a second selection signal (for example, a high-level signal) through the reuse pin 30 at a time of reuse. When the first selection signal is inputted via the reuse pin 30 and the reuse pad 24, the selection circuit 38 outputs a trimming signal representing the first trimming information stored in the first fuse circuit 32 to the trimming circuit 46, and when the second selection signal is inputted, the selection circuit 38 outputs a trimming signal representing the second trimming information stored in the second fuse circuit 34 to the trimming circuit 46.

When the trimming signal representing the first trimming information is inputted to the trimming circuit 46, the trimming circuit 46 adjusts the resistance value of the resistance division circuit 48 to a resistance value corresponding to the first trimming information. Hence, the reference current flows at the second current source 44 with the first current value REF0.

When the trimming signal representing the second trimming information is inputted to the trimming circuit 46, the trimming circuit 46 adjusts the resistance value of the resistance division circuit 48 to a resistance value corresponding to the second trimming information. Hence, the reference current flows at the second current source 44 with the second current value REF1.

Now operation and effects of the present exemplary embodiment are described with reference to FIG. 3, FIG. 4A and FIG. 4B. FIG. 3 is a diagram illustrating an example of reuse flow of the semiconductor nonvolatile memory device. FIG. 4A and FIG. 4B are explanatory views describing variations in characteristics of a memory cell when first used and when reused, and reference current setting states of the reference current circuit 28. Here, as memory cell characteristics, distributions of cell currents corresponding to logical 0 and logical 1 after writing are represented as distributions of expected value 0 and expected value 1.

In FIG. 3, firstly, at a test stage before shipping of the memory chip 10, a wafer test and data writing are performed, and then the data is erased and the memory chip 10 is assembled into a package. Thereafter, the memory chip 10 is shipped as a blank with no data at all written thereto.

A user writes data A to the memory chip 10 at a stage of first use. Before reading the data A, the user inputs the first selection signal to the reuse pin 30. As a result, the reference value of the reference current of the reference current circuit 28 is set to the first current value REF0. As illustrated in FIG. 4A, the first current value REF0 has a magnitude corresponding to the memory cell characteristics at the time of first use, and a margin required for reading is assured.

Then, at a stage of reuse, a user erases the data A that was written. After the erasure processing, the user writes data B with a writing circuit. Then, before reading the data B written after the erasure of data A, the user inputs the second selection signal to the reuse pin 30.

As a result, the current value of the reference current of the reference current circuit 28 is set to the second current value REF1. As illustrated in FIG. 4B, the memory cell characteristics are altered by the erasure processing. Therefore, in this example, if the reference current of the reference current circuit 28 were left at the first current value REF0, a sufficient reading margin would not be assured. However, in the present exemplary embodiment, because the magnitude of the current value of the reference current from the reference current circuit 28 is changed to be set to the second current value REF1 with a magnitude corresponding to the memory cell characteristics of the time of reuse, the margin required for reading is assured.

According to the present exemplary embodiment as described above, reference current trimming information is stored in each of the first fuse circuit 32 and the second fuse circuit 34. Consequently, reference currents may flow in accordance with a change in memory cell characteristics for a time of reuse. Thus, the implementation of reuse, an increase in a number of times of reuse, and an improvement in reliability of reading of the memory cells at a time of reuse may be promoted.

Second Exemplary Embodiment

Next, a second exemplary embodiment is described with reference to FIG. 5 and FIG. 6. FIG. 5 is an overall structural diagram of a semiconductor nonvolatile memory device of the present exemplary embodiment. In FIG. 5, portions that are the same as or equivalent to those in FIG. 1 are assigned the same reference numerals, and descriptions thereof are not given.

As illustrated in FIG. 5, the semiconductor nonvolatile memory device of the present exemplary embodiment is provided with a memory chip 70 and a control chip or control circuit 74 (in the present exemplary embodiment, an example of a control chip is presented and described), at which an I/O pad portion 76 is provided.

The memory chip 70 is provided with a reference current trimming fuse selection value latch circuit 72 in place of the reuse pad 24 and reuse pin 30 of the first exemplary embodiment. The reference current trimming fuse selection value latch circuit 72 latches (stores) a fuse selection value for selecting the first fuse circuit 32 or the second fuse circuit 34.

The control chip 74 generates the fuse selection value. The I/O pad portion 76 is a terminal portion for inputting commands and the like to the control chip 74 and outputting the fuse selection value generated by the control chip 74. The I/O pad portion 76 is connected to the I/O pad portion 22, and signals and the like that are outputted through the I/O pad portion 76 are inputted to the I/O pad portion 22.

Now operation and effects of the present exemplary embodiment are described with reference to FIG. 6. FIG. 6 is a diagram illustrating a timing chart of signals generated when a fuse selection value is latched into the reference current trimming fuse selection value latch circuit 72.

First, a user applies a power source voltage VCC to the semiconductor nonvolatile memory device and turns on the power source, and sets a test mode signal TEST to High to set the memory chip 70 into a test mode.

Then, in a period in which a chip enable signal CEB is Low (a command effective period), the user inputs, through the I/O pad portion 76, mode (specifications) setting information of the memory chip 10, data required for setting of the memory chip such as access permission information and the like, and a command representing selection information that selects the first fuse circuit 32 or the second fuse circuit 34. At a time of first use, a user inputs command 0 to select the first fuse circuit 32, and at subsequent times of reuse, the user inputs command 1 to select the second fuse circuit 34.

The control chip 74 generates and outputs a fuse selection value in response to the inputted command. For example, if command 0 is inputted, the control chip 74 generates and outputs a fuse selection value 0 such that the first fuse circuit 32 is selected, and if command 1 is inputted, the control chip 74 generates and outputs a fuse selection value 1 such that the second fuse circuit 34 is selected. The outputted fuse selection value is latched into the reference current trimming fuse selection value latch circuit 72 via the I/O pad portion 22.

While the power source is turned on, the selection circuit 38 selects the first fuse circuit 32 or the second fuse circuit 34 on the basis of the fuse selection value latched in the reference current trimming fuse selection value latch circuit 72, uses the trimming information stored in the selected fuse circuit to generate a trimming signal, and controls the current value of the reference current. Here, if the fuse selection value is 0, the first fuse circuit 32 is selected and the trimming information is read from the first fuse circuit 32, and if the fuse selection value is 1, the second fuse circuit 34 is selected and the trimming information is read from the second fuse circuit 34.

According to the present exemplary embodiment as described above, reference current trimming information is stored in each of the first fuse circuit 32 and the second fuse circuit 34, and when the memory chip 70 is to be used, a command is inputted to the control chip 74 for selecting the first fuse circuit 32 or the second fuse circuit 34, and a fuse selection value from the control chip 74 is latched into the reference current trimming fuse selection value latch circuit 72 and used to set the current value of the reference current. Therefore, in addition to the effects described for the first exemplary embodiment, the reference current may be specified in accordance with a change in memory cell characteristics for a time of reuse without the number of pins on the package being increased.

Third Exemplary Embodiment

Next, a third exemplary embodiment is described with reference to FIG. 7, FIG. 8 and FIG. 9. FIG. 7 is an overall structural diagram of a semiconductor nonvolatile memory device of the present exemplary embodiment. In FIG. 7, portions that are the same as or equivalent to those in FIG. 1 and FIG. 5 are assigned the same reference numerals, and descriptions thereof are not given.

As illustrated in FIG. 7, the semiconductor nonvolatile memory device of the present exemplary embodiment is provided with a memory chip 80 and the control chip or control circuit 74 (in the present exemplary embodiment, an example of a control chip is presented and described), at which the I/O pad portion 76 is provided.

In the memory chip 80, a first reference current information storage region 14a and a second reference current information storage region 14b are provided at the memory array portions 14 in place of the first fuse circuit 32 and second fuse circuit 34 of the first and second exemplary embodiments. In the present exemplary embodiment, an example is described in which the first reference current information storage region 14a is provided at one of the two memory array portions 14 and the second reference current information storage region 14b is provided at the other. However, a configuration is possible in which the first reference current information storage region 14a and the second reference current information storage region 14b are both provided at one of the two memory array portions 14.

The memory chip 80 is further provided with a reference current trimming information latch circuit 82 in place of the reference current trimming fuse selection value latch circuit 72 of the second exemplary embodiment. The reference current trimming information latch circuit 82 is for latching trimming information read from the first reference current information storage region 14a or the second reference current information storage region 14b.

The control chip 74 of the present exemplary embodiment outputs commands, addresses and the like that are inputted through the I/O pad portion 76 to the I/O pad portion 22.

In the present exemplary embodiment too, similarly to the first and second exemplary embodiments, the current value of the reference current for the time of first use (the first current value REF0) is determined in advance in accordance with the memory cell characteristics of the time of first use, and the current value of the reference current for subsequent times of reuse (the second current value REF1) is determined in advance in accordance with the memory cell characteristics of times of reuse.

Then, at the time of the wafer test before shipping (see FIG. 3), the first trimming information for specifying the current value of a reference current to be generated by the reference current circuit 28 is specified as the first current value REF0 and is written to the first reference current information storage region 14a, and the second trimming information for specifying the current value of a reference current to be generated by the reference current circuit 28 is specified as the second current value REF1 and is written to the second reference current information storage region 14b.

It is sufficient that writing of the first trimming information to the first reference current information storage region 14a be carried out before data written at the time of first use after shipping is read out; the writing is not limited to being carried out before shipping. Similarly, it is sufficient that writing of the second trimming information to the second reference current information storage region 14b be carried out before data written at a time of reuse after shipping is read out; the writing is not limited to being carried out before shipping.

Figure 8:
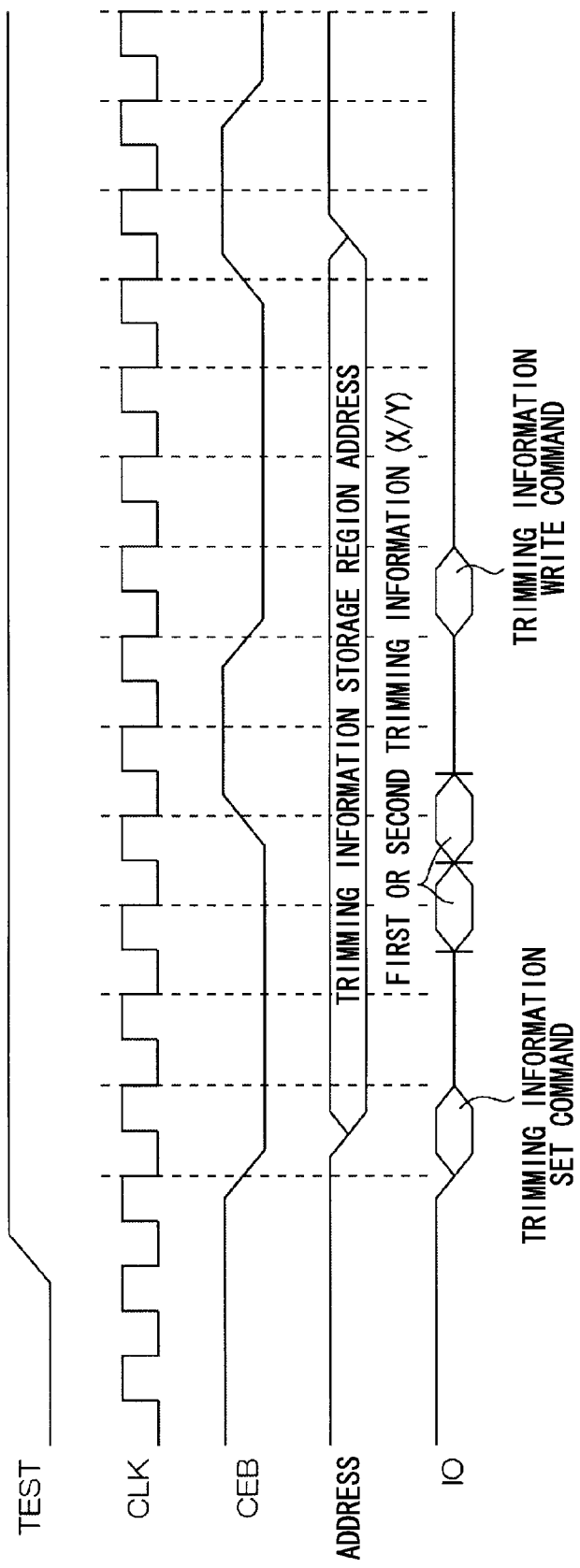
FIG. 8 is a diagram illustrating a timing chart of signals generated when trimming information is being written to a first reference current trimming information storage region and a second reference current trimming information storage region of the third exemplary embodiment.

FIG. 8 is a diagram illustrating a timing chart of signals that are generated when the trimming information is being written to the first reference current information storage region 14a and the second reference current information storage region 14b.

First, a semiconductor manufacturer or a user sets the test mode signal TEST to High, and sets the memory chip 80 into the test mode. Then, in a period in which the chip enable signal CEB is Low (a command effective period), the semiconductor manufacturer or user designates a writing destination address at the I/O pad portion 22 (i.e., the first reference current information storage region 14a or the second reference current information storage region 14b). The semiconductor manufacturer or user also inputs a trimming information set command in the command effective period. The trimming information set command is a command that starts a writing operation at the writing circuit included at the third circuit portion 36 of the memory chip 80. Then, the semiconductor manufacturer or user inputs the first trimming information to be written to the first reference current information storage region 14a or the second trimming information to be written to the second reference current information storage region 14b, and the inputted trimming information is latched into the writing circuit. Then, the semiconductor manufacturer or user inputs a trimming information write command. When the trimming information write command is inputted, the writing circuit writes the latched trimming information to the designated address.

In the present exemplary embodiment, the trimming information write command is the same regardless of the storage region, and the first reference current information storage region 14a or second reference current information storage region 14b is selected and written to by the address.

After shipping, the current value of the reference current is specified before data is read from the memory chip 80.

Figure 9:
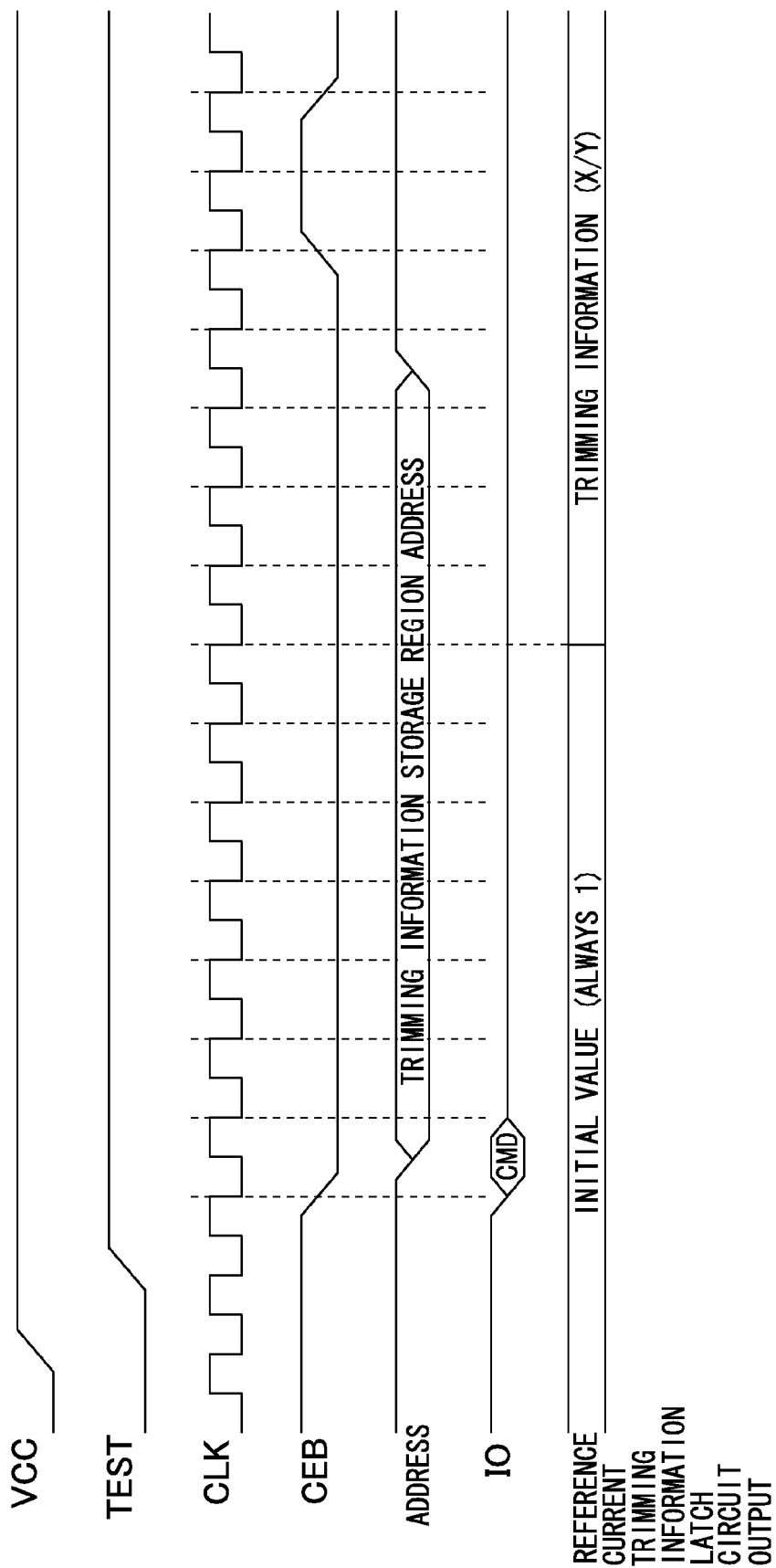
FIG. 9 is a diagram illustrating a timing chart of signals generated when trimming information is latched into a reference current trimming information latch circuit of the third exemplary embodiment.

FIG. 9 is a diagram illustrating a timing chart of signals when the trimming information is being latched into the reference current trimming information latch circuit 82.

First, a user applies a power source voltage VCC to the semiconductor nonvolatile memory device and turns on the power source, and sets the test mode signal TEST to High to set the memory chip 80 into the test mode.

Then, in a period in which the chip enable signal CEB is Low (a command effective period), the user inputs, through the I/O pad portion 76, a latch command for reading the trimming information and latching the trimming information into the reference current trimming information latch circuit 82 and an address representing the region for reading of the trimming information. More specifically, at a time of first use, the user inputs the latch command and the address of the first reference current information storage region 14a to the I/O pad portion 76. At subsequent times of reuse, when the user turns on the power source to the semiconductor nonvolatile memory device, the user inputs the latch command and the address of the second reference current information storage region 14b to the I/O pad portion 76.

The control chip 74 outputs the latch command and the designated address to the I/O pad portion 22 of the memory chip 80. When the latch command and the address are inputted from the control chip 74, the reference current trimming information latch circuit 82 reads the trimming information that has been written to the reference current trimming information storage region indicated by the inputted address, and latches the trimming information. That is, when the trimming information is read from a memory array portion 14, an output signal outputted from the amplifier circuit 16 (trimming information) is latched into the reference current trimming information latch circuit 82 rather than a latch circuit that is used at usual times of reading. At this time of reading, the resistance value of the resistance division circuit 48 is controlled by the trimming circuit 46 such that the reference current flows with a current value specified in advance prior to adjustment by the trimming information. The latched trimming information is outputted to the trimming circuit 46 as a trimming signal and, while the power source is turned on, the current value of the reference current is controlled to the current value according to the trimming information.

Thus, in the present exemplary embodiment, the latch command is the same regardless of the storage region, and the first reference current information storage region 14a or the second reference current information storage region 14b is selected by the address.

In the present exemplary embodiment, an example is described in which a user inputs the latch command and an address at the control chip 74, and the inputted latch command and address are outputted from the control chip 74 to the reference current trimming information latch circuit 82 via the I/O pad portion 76 and the I/O pad portion 22, but this is not to be limiting. For example, a configuration is possible in which two commands are prepared beforehand, a command 0 and a command 1. When a user inputs command 0 through the I/O pad portion 76, the control chip 74 may convert command 0 to the address of the first reference current information storage region 14a and output the latch command and the converted address to the reference current trimming information latch circuit 82, and when a user inputs command 1 through the I/O pad portion 76, the control chip 74 may convert command 1 to the address of the second reference current information storage region 14b and output the latch command and the converted address to the reference current trimming information latch circuit 82.

As described above, according to the present exemplary embodiment, no fuse circuit is provided but regions for storing trimming information are provided in the memory array portions 14 and the trimming information is written thereto. Therefore, in addition to the effects described in the first exemplary embodiment and the second exemplary embodiment, the fuse circuits are not necessary and a laser cutting step may be removed. Furthermore, the trimming information may be determined and used at a test stage after package assembly, at a time of manufacturer recall during reuse or the like. That is, when a fuse circuit is used, laser cutting must be performed in advance, whereas when a portion of the memory array portions 14 is used for storing trimming information, the trimming information may be written after the wafer test, and therefore the trimming information may be determined from memory cell characteristics after shipping.

Note that in the present exemplary embodiment, when the trimming information is being latched into the reference current trimming information latch circuit 82, the trimming information must be read in a state in which the current value of the reference current has not been set by the trimming circuit 46 to a value according to the memory cell characteristics.

Therefore, for the trimming information to be read reliably, writing thereof may be carried out by the writing circuit such that a current difference between expected value 0 and expected value 1 of the memory cells is sufficiently large.

For example, if the memory array portions 14 are memory array portions in which the memory cells that are arrayed are each provided with charge accumulation portions at both sides of the gate (see FIG. 13B) and one bit may be stored at each charge accumulation portion (hereinafter referred to as two-bit memory cells), only the charge accumulation portions at one side of each gate are used and the charge accumulation portions at the other side are in a non-used state (a state in which a logical value 1 is not written). In other words, the two-bit memory cells are used as one-bit memory cells.

This is because, usually, if the memory cells 52 are two-bit cells and data is read from the charge accumulation portions, the directions of voltages applied to the source and drain of each memory cell 52 are made different for reading the two bits. When data is being read from one charge accumulation portion, reading in a state in which the electrons are not accumulated in the other charge accumulation portion provides a larger cell current than if this is not the case.

When the trimming information is being written to the first reference current information storage region 14a or the second reference current information storage region 14b, if the respective memory cells 52 of the storage regions are used as one-bit memory cells, the current difference between expected value 0 and expected value 1 of the memory cells is sufficiently large, and a sufficient reading margin may be assured.

Further, when trimming information is being written, the trimming information may be written by applying a voltage that is higher than a voltage specified in the specifications to each gate and making the injection amount of electrons larger than a usual injection amount. As a result, the cell currents at times of reading are made larger than usual.

When trimming information is being read, it may be read by applying a voltage that is different from a voltage specified by the specifications to the memory cells. For example, a configuration is possible in which, when trimming information is being read, the magnitude of a voltage that is applied to the gates of the MOS transistors of the memory cells 52 of the first reference current information storage region 14a or the second reference current information storage region 14b is a voltage larger than the magnitude of a voltage for reading that is specified by the specifications. More specifically, for example, a circuit is provided for making the magnitude of a voltage that is applied to the gates by the word driver circuit 54 while the chip enable signal is low larger than the magnitude of the voltage for reading specified by the specifications, or the like.

A configuration is also possible in which a voltage difference between the drain and source of each MOS transistor of the memory cells 52 of the first reference current information storage region 14a or the second reference current information storage region 14b is made larger than a voltage difference for reading that is specified by the specifications. More specifically, for example, a circuit is provided for making a difference between voltages that are applied to the drain and source via the drain selector driver circuit 56 and the source selector driver circuit 58 while the chip enable signal is low larger than the voltage difference for reading specified by the specifications, or the like.

Thus, by applying voltages to the gates, sources and drains, larger differences between cell currents of expected value 0 and expected value 1 may be produced.

When trimming information is being read, it may be read with a timing different from a reading timing specified by the specifications. Usually, when data is being read from the memory array portions 14, the data is read as quickly as possible. Therefore, with the specifications, it is often the case that a signal is outputted from the amplifier circuit 16 and read and latched as data in a transitory timing after voltages being applied to the drain, source and gate of the memory cell 52, in which charge cannot be properly collected. This means that if the reference current trimming information latch circuit 82 is configured such that a signal outputted from the amplifier circuit 16 at a time after a duration longer than the duration specified in the specifications has passed after the voltages being applied to the drain, source and gate of the memory cell 52 is read and latched as data, the difference between a cell current when expected value 0 is being read from a charge accumulation portion and a cell current when expected value 1 is being read from a charge accumulation portion is large, and a sufficient reading margin may be assured.

Fourth Exemplary Embodiment

Figure 10:
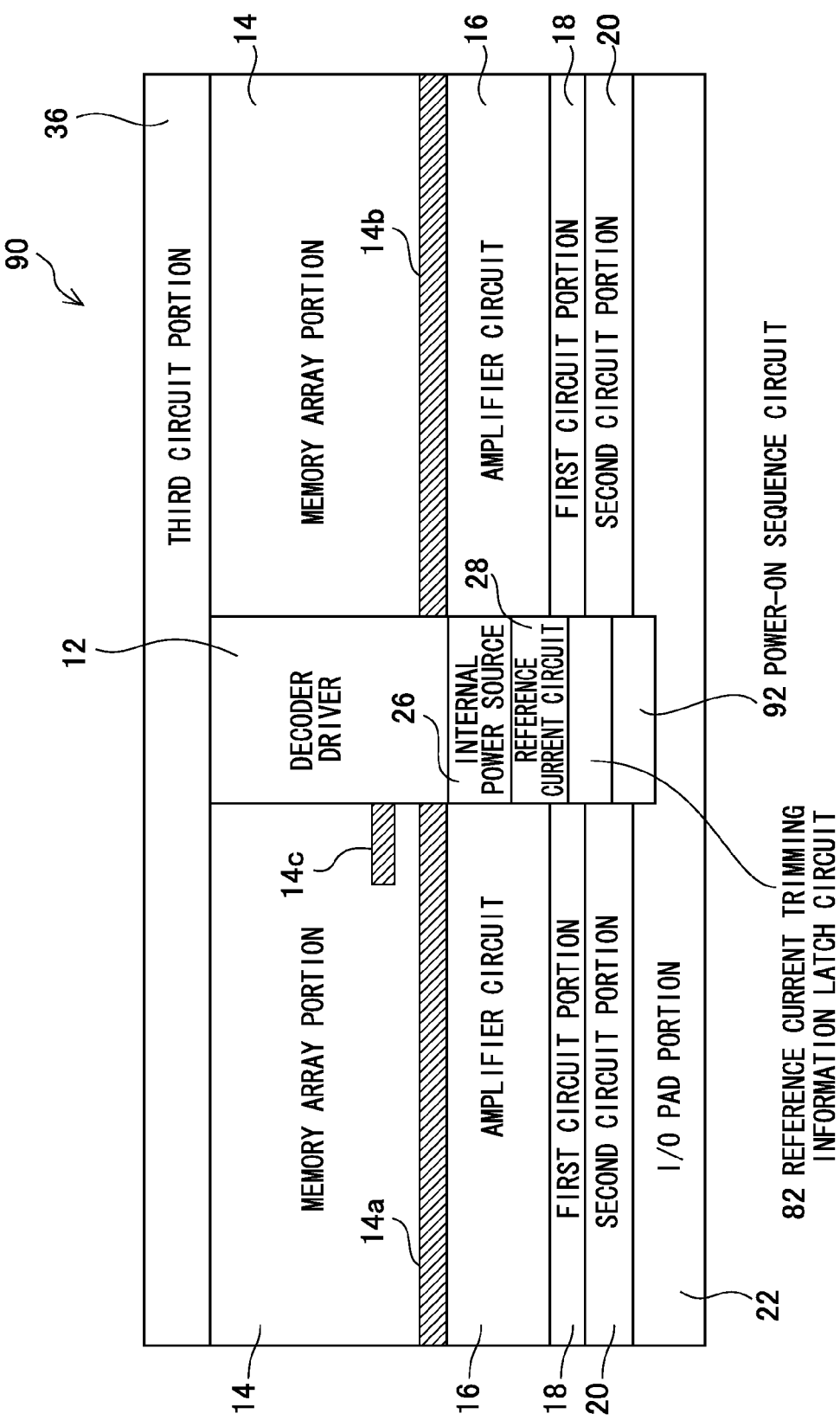
FIG. 10 is an overall structural diagram of a memory chip that serves as a semiconductor nonvolatile memory device of a fourth exemplary embodiment.

A fourth exemplary embodiment is described with reference to FIG. 10 and FIG. 11. FIG. 10 is an overall structural diagram of a memory chip 90 of a semiconductor nonvolatile memory device of the present exemplary embodiment. In FIG. 10, portions that are the same as or equivalent to those in FIG. 1, FIG. 5 and FIG. 7 are assigned the same reference numerals, and descriptions thereof are not given.

In the present exemplary embodiment, a power-on sequence circuit 92 is provided in place of the control chip or control circuit of the third exemplary embodiment, and a reference current trimming information storage region selection data storage region 14c is provided at the memory array portion 14.

Selection data for selecting one or other of the first reference current information storage region 14a and the second reference current information storage region 14b is written to the reference current trimming information storage region selection data storage region 14c. In the present exemplary embodiment, selection data 1, for selecting the first reference current information storage region 14a, is written to the reference current trimming information storage region selection data storage region 14c before data written at the time of first use after shipping is read. After erasure processing has been carried out after the first use, selection data 0, for selecting the second reference current information storage region 14b, is written to the reference current trimming information storage region selection data storage region 14c before data written at a time of reuse is read. The writing sequence of the selection data may be carried out in a similar manner to the third exemplary embodiment as described using FIG. 8, so is not described here.

Figure 11:
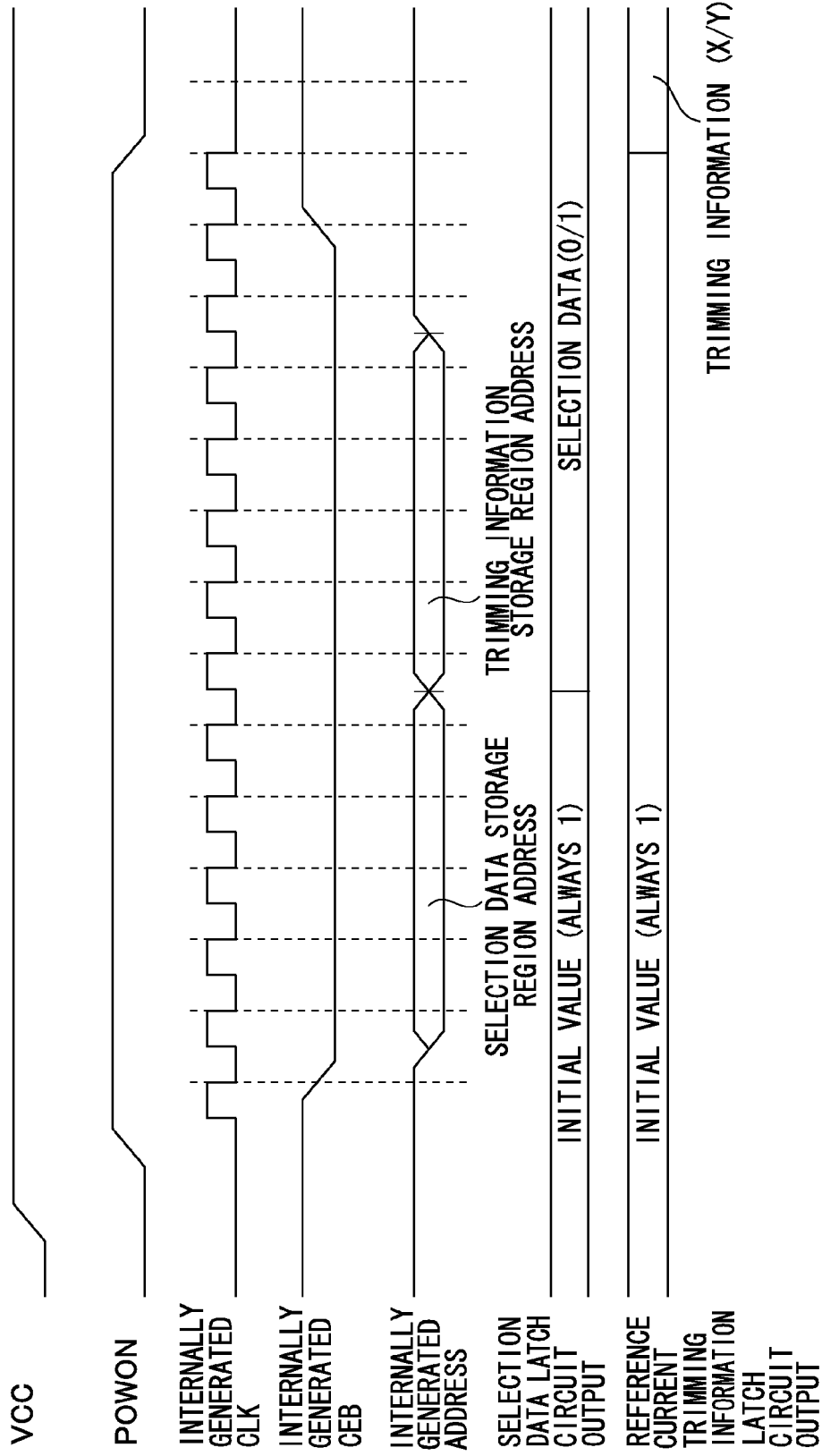
Figure 12A:
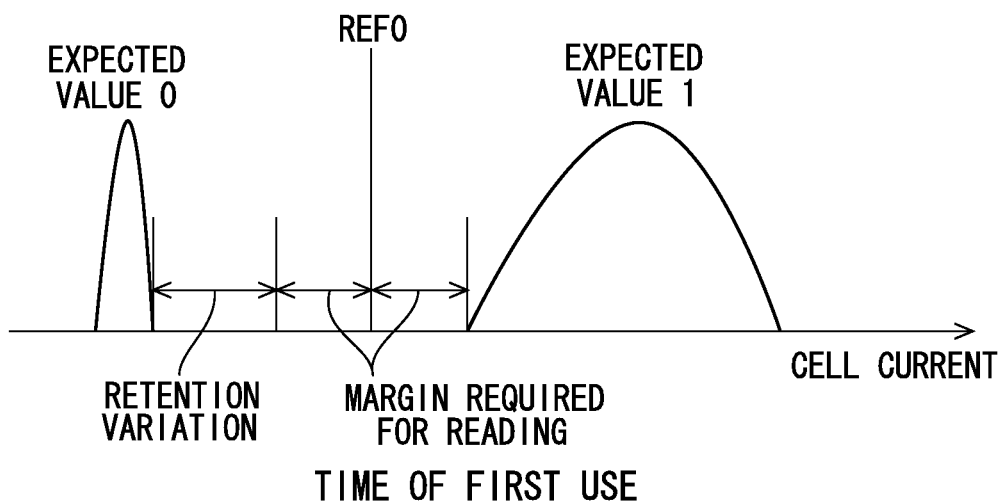
FIG. 12A and FIG. 12B are explanatory diagrams describing changes in characteristics of a memory when first used and when reused, and a state in which a reading margin may not be assured.
Figure 12B:
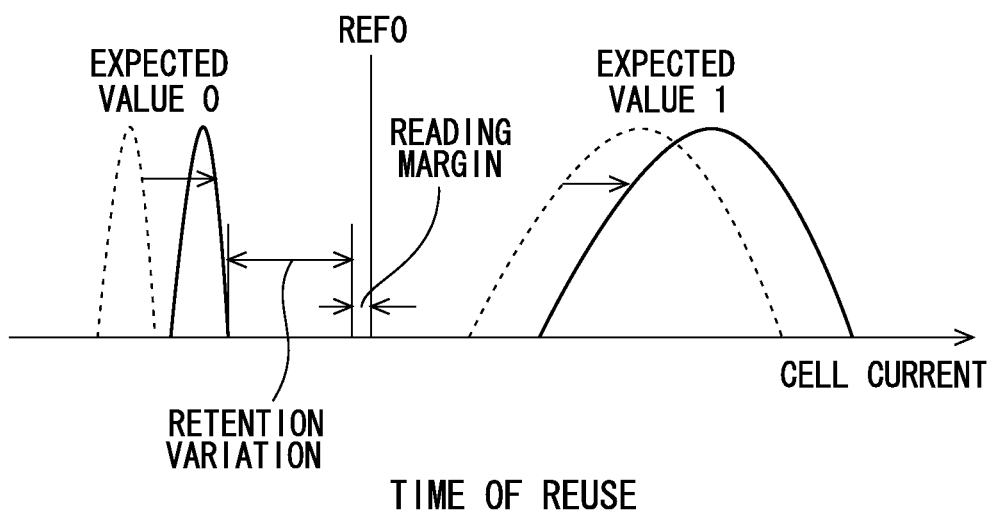

Now, operation and effects of the present exemplary embodiment are described while referring to FIG. 11. FIG. 11 is a diagram illustrating a timing chart of signals when the power source of the memory chip 90 is turned on.

When a user applies the voltage VCC to the memory chip 90 and turns on the power source, the power-on sequence circuit 92 starts up. After the power-on sequence circuit 92 starts up, a power-on signal POWON is set to High, an internal clock CLK is generated, and then the internal chip enable signal CEB is generated.

While the internal chip enable signal CEB is low, the power-on sequence circuit 92 generates the address of the reference current trimming information storage region selection data storage region 14c. Then, the selection data stored at this address is read out and is latched into a selection data latch circuit provided inside the power-on sequence circuit 92. That is, when the selection data is read from the memory array portion 14, an output signal outputted from the amplifier circuit 16 (the selection data) is latched into the power-on sequence circuit 92 rather than a latch circuit that is used for usual reading. At this time of reading, the resistance value of the resistance division circuit 48 is controlled by the trimming circuit 46 such that a reference current with a current value specified in advance prior to adjustment by the trimming information flows, and the reading is carried out.

Next, the power-on sequence circuit 92 generates the address of the storage region corresponding to the latched selection data. Specifically, if the latched selection data is 1, the power-on sequence circuit 92 generates the address of the first reference current information storage region 14a, and if the attached selection data is 0, the power-on sequence circuit 92 generates the address of the second reference current information storage region 14b.

The power-on sequence circuit 92 reads trimming information from the first reference current information storage region 14a or second reference current information storage region 14b whose address is designated by the selection data, and latches the trimming information into the reference current trimming information latch circuit 82. That is, when trimming information is read from the memory array portions 14, the output signal outputted from the amplifier circuit 16 (the trimming information) is latched into the reference current trimming information latch circuit 82 rather than the latch circuit that is used for usual reading. At this time of reading, the resistance value of the resistance division circuit 48 is controlled by the trimming circuit 46 such that a reference current with a current value specified in advance prior to adjustment by the trimming information flows, and the reading is carried out.

When the power-on signal POWON outputted by the power-on sequence circuit 92 has been set to Low, the trimming information latched into the reference current trimming information latch circuit 82 becomes active, and the reference current trimming information latch circuit 82 outputs the latched trimming information to the trimming circuit 46 as a trimming signal. While the power source is turned on, the current value of the reference current is controlled to the current value according to the trimming information.

In the present exemplary embodiment, when the trimming information is being latched into the reference current trimming information latch circuit 82, the reading must be performed in a state in which the current value of the reference current is not set by the trimming circuit 46 to a value according to memory cell characteristics and in which the power source voltage is not stable.

Therefore, in order to reliably read the selection data from the reference current trimming information storage region selection data storage region 14c and the trimming information from the first reference current information storage region 14a and second reference current information storage region 14b, as described in the third exemplary embodiment, two-bit memory cells may be used as one-bit memory cells and the selection data and trimming information may be written such that a current difference between expected value 0 and expected value 1 of the memory cells is sufficiently large. This writing may also be performed with the voltage value(s) for writing being made larger than the voltage value (s) specified by the specifications.

During reading too, as described in the third exemplary embodiment, configurations are possible in which respective voltages are applied such that voltages applied to the gates of the MOS transistors of the memory cells 52 are larger than usual and/or voltage differences applied to the drains and sources of the MOS transistors of the memory cells 52 are larger than usual, and the reading may be performed with a slower timing than the timing specified in the specifications. Thus, the current difference between expected value 0 and expected value 1 of the memory cells may be made sufficiently large and the reading margin may be assured.

As described above, according to the present exemplary embodiment, the reference current may be specified in accordance with memory cell characteristics at times of reuse without a special command for specifying the reference current being inputted each time the power source is turned on.

Other Variant Examples

In the first to fourth exemplary embodiments, examples are described in which each memory cell 52 includes charge accumulation portions at both sides of the gate, but this is not to be limiting. For example, a charge accumulation portion may be included at one side of the gate, or a charge accumulation portion may be included in a layer below the gate.

Usually, a sum of amounts of change in the distributions of expected values 0 and 1 and an amount of change in the retention variation is particularly large between a time of first use after shipping (the first use) and a time of a next use after the first use (a first reuse). Accordingly, in the first to fourth exemplary embodiments, examples are described in which the current value of the reference current is different between the time of first use and the time of reuse, but this is not to be limiting. For example, the sum of the amount of changes in the distributions of expected value 0 and 1 and the amount of change of the retention variation may be in a tolerance range and the margin required for reading may be assured until a plural number of reuses after the first use, and only subsequently the tolerance range may be exceeded and the margin required for reading may not be assured. In such a case, the current value of the reference current may be used without change for a pre-specified number of uses in which the tolerance range is not exceeded, and the reference current value may be changed after that number of uses.

As a device is reused, amounts of shifting of the distributions of expected value 0 and expected value 1 from the first use tend to increase. Therefore, the current value of the reference current may be changed so as to increase as the number of times of reuse increases. Further, rather than the current value being changed each time, the current value may be changed in steps at intervals of a plural number of uses. In such a case, in the first and second exemplary embodiments, three or more of the fuse circuits are provided rather than two, trimming information for generating reference currents with respectively different reference values is stored therein, and is selected and used in the same manner as in the first and second exemplary embodiments. In the third and fourth exemplary embodiments, three or more of the reference current trimming information storage regions for storing trimming information are provided in the memory array portions 14, and are selected and used in the same manner as in the third and fourth exemplary embodiments.

According to a first aspect of the present invention, there is provided a semiconductor nonvolatile memory device including: a memory array portion in which nonvolatile memory cells are plurally arranged; an output circuit that outputs setting information selected from a plurality of sets of setting information to generate reference currents with different current values; a reference current circuit that generates a reference current with a current value according to the setting information outputted from the output circuit; and an amplifier circuit that compares a cell current outputted from a selected memory cell of the memory array portion with the reference current generated by the reference current circuit.

According to this configuration, even if, for example, memory cell characteristics change between when the semiconductor nonvolatile memory device is first used after shipping (the time of first use) and when data written at the time of first use is erased and the semiconductor nonvolatile memory device is reused, a reference current may be generated with a current value corresponding to setting information selected from the plural sets of setting information in accordance with the change. Therefore, an improvement in reliability of reading of the memory cells at times of reuse may be promoted, and the implementation of reuse and an increase in the number of times of reuse may be promoted.

According to a second aspect of the present invention, in the first aspect, the semiconductor nonvolatile memory device may further include: a plurality of fuse circuits that respectively include fuse elements; and a pin at which a selection signal selecting a fuse circuit is inputted, wherein the plurality of sets of setting information may be stored by cutting fuse elements of each of the plurality of fuse circuits, and the output circuit may read setting information stored in the fuse circuit that is selected from the plurality of fuse circuits by the selection signal inputted through the pin, and may output the setting information to the reference current circuit.

According to a third aspect of the present invention, in the first aspect, the semiconductor nonvolatile memory device may further include: a plurality of fuse circuits that respectively include fuse elements; a latch circuit that latches a selection signal that selects a fuse circuit; and a control unit that, when a command for generating the selection signal is inputted, generates and latches a selection signal, according to the inputted command, into the latch circuit, wherein the plurality of sets of setting information may be stored by cutting fuse elements of each of the plurality of fuse circuits, and the output circuit may read setting information stored in the fuse circuit that is selected from the plurality of fuse circuits by the selection signal which is latched into the latch circuit, and may output the setting information to the reference current circuit.

According to a fourth aspect of the present invention, in the first aspect, the plurality of sets of setting information may be stored in a predetermined plurality of setting information storage regions of the memory array portion, and when a command to read setting information is inputted, the output circuit may read and latch setting information stored in a setting information storage region that is selected from the plurality of setting information storage regions, and may output the latched setting information to the reference current circuit.

According to a fifth aspect of the present invention, in the fourth aspect, each of the plurality of memory cells arranged in the memory array portion may be provided with a plurality of charge accumulation portions, and the setting information may be stored using a charge accumulation portion of the plurality of charge accumulation portions of each memory cell arranged in the setting information storage regions.

According to a sixth aspect of the present invention, in the fourth or fifth aspect, the semiconductor nonvolatile memory device may further include an application unit that, when the output circuit reads the setting information stored in a setting information storage region, performs at least one of a first application operation that applies a voltage to the gate of a MOS transistor included in each memory cell of the setting information storage region, which voltage is larger than a magnitude of a voltage for reading which is specified by specifications, or a second application operation that applies voltages to each of the drain and source of the MOS transistor included in each memory cell of the setting information storage region, a voltage difference between the voltage applied to the drain and the voltage applied to the source being larger than a voltage difference specified by the specifications.

According to a seventh aspect of the present invention, in the fourth to sixth aspects, when the output circuit reads the setting information stored in the setting information storage region, the output circuit may read at a timing slower than a reading timing specified by specifications.

According to an eighth aspect of the present invention, in the first aspect, the plurality of sets of setting information may be stored in a predetermined plurality of setting information storage regions of the memory array portion, and selection data for selecting any of the setting information storage regions may be stored in a predetermined selection data storage region of the memory array portion, and when a power source is turned on, the output circuit may read and latch the setting information stored in the setting information storage region that is selected by the selection data stored in the selection data storage region, and may output the latched setting information to the reference current circuit.

According to a ninth aspect of the present invention, in the eighth aspect, each of the plurality of memory cells arranged in the memory array portion may be provided with a plurality of charge accumulation portions, and the selection data may be stored using a charge accumulation portion of the plurality of charge accumulation portions of each memory cell arranged in the selection data storage region, and the setting information may be stored using a charge accumulation portion of the plurality of charge accumulation portions of each memory cell arranged in the setting information storage regions.

According to a tenth aspect of the present invention, in the eighth or ninth aspect, the semiconductor nonvolatile memory device may further include an application unit that, when the output circuit reads the selection data stored in the selection data storage region and the setting information stored in the setting information storage region, performs at least one of a first application operation that applies a voltage to the gate of a MOS transistor included in each memory cell of the selection data storage region and the setting information storage region, which voltage is larger than a magnitude of a voltage for reading which is specified by specifications, or a second application operation that applies voltages to each of the drain and source of the MOS transistor included in each memory cell of the selection data storage region and the setting information storage region, a voltage difference between the voltage applied to the drain and the voltage applied to the source being larger than a voltage difference specified by the specifications.

According to an eleventh aspect of the present invention, in the eighth to tenth aspects, when the output circuit reads the selection data stored in the selection data storage region and the setting information stored in the setting information storage region, the output circuit may read at a timing slower than a reading timing specified by specifications.

According to a twelfth aspect of the present invention, in the first to eleventh aspects, the output circuit may output the setting information selected from the plurality of sets of setting information to the reference current circuit such that the current value of the reference current increases when a number of reuses of the memory array portion increases.

According to the present invention as described above, a fall in reliability of reading during reuse may be suppressed.

Embodiments of the present invention are described above, but the present invention is not limited to the embodiments as will be clear to those skilled in the art.

What is claimed is:

1. A semiconductor nonvolatile memory device comprising:
a memory array portion in which nonvolatile memory cells are plurally arranged;
an output circuit that outputs setting information selected from a plurality of sets of setting information to generate reference currents with different current values for a time of first use or a time from second use;
a reference current circuit that generates a reference current with a current value according to the setting information outputted from the output circuit;
an amplifier circuit that compares a cell current outputted from a selected memory cell of the memory array portion with the reference current generated by the reference current circuit;
a plurality of fuse circuits that respectively include fuse elements; and
a pin at which a selection signal selecting a fuse circuit is inputted, the selection signal indicating the time of first use or the time from second use,
wherein the plurality of sets of setting information are stored by cutting fuse elements of each of the plurality of fuse circuits, and
the output circuit reads setting information stored in the fuse circuit that is selected from the plurality of fuse circuits by the selection signal inputted through the pin, and outputs the setting information to the reference current circuit.

2. The semiconductor nonvolatile memory device according to claim 1, wherein the output circuit outputs the setting information selected from the plurality of sets of setting information to the reference current circuit such that the current value of the reference current increases when a number of reuses of the memory array portion increases.

3. A semiconductor nonvolatile memory device comprising:
a memory array portion in which nonvolatile memory cells are plurally arranged;
an output circuit that outputs setting information selected from a plurality of sets of setting information to generate reference currents with different current values for a time of first use or a time from second use;
a reference current circuit that generates a reference current with a current value according to the setting information outputted from the output circuit;
an amplifier circuit that compares a cell current outputted from a selected memory cell of the memory array portion with the reference current generated by the reference current circuit;
a plurality of fuse circuits that respectively include fuse elements;
a latch circuit that latches a selection signal that selects a fuse circuit; and
a control unit that, when a command for generating the selection signal is inputted, generates and latches a selection signal, according to the inputted command, into the latch circuit, the command indicating the time of first use or the time from second use,
wherein the plurality of sets of setting information are stored by cutting fuse elements of each of the plurality of fuse circuits, and
the output circuit reads setting information stored in the fuse circuit that is selected from the plurality of fuse circuits by the selection signal which is latched into the latch circuit, and outputs the setting information to the reference current circuit.

4. The semiconductor nonvolatile memory device according to claim 3, wherein the output circuit outputs the setting information selected from the plurality of sets of setting information to the reference current circuit such that the current value of the reference current increases when a number of reuses of the memory array portion increases.

5. A semiconductor nonvolatile memory device comprising:
a memory array portion in which nonvolatile memory cells are plurally arranged;
an output circuit that outputs setting information selected from a plurality of sets of setting information to generate reference currents with different current values for a time of first use or a time from second use;
a reference current circuit that generates a reference current with a current value according to the setting information outputted from the output circuit; and an amplifier circuit that compares a cell current outputted from a selected memory cell of the memory array portion with the reference current generated by the reference current circuit;

wherein the plurality of sets of setting information are stored in a predetermined plurality of setting information storage regions of the memory array portion, and when a command to read setting information is inputted, the command indicates the time of first use or the time from second us, the output circuit reads and latches setting information stored in a setting information storage region that is selected from the plurality of setting information storage regions, and outputs the latched setting information to the reference current circuit.

6. The semiconductor nonvolatile memory device according to claim 5, wherein each of the plurality of memory cells arranged in the memory array portion is provided with a plurality of charge accumulation portions, and the setting information is stored using a charge accumulation portion of the plurality of charge accumulation portions of each memory cell arranged in the setting information storage regions.

7. The semiconductor nonvolatile memory device according to claim 5, further comprising an application unit that, when the output circuit reads the setting information stored in a setting information storage region, performs at least one of a first application operation that applies a voltage to the gate of a MOS transistor included in each memory cell of the setting information storage region, which voltage is larger than a magnitude of a predetermined voltage for reading, or a second application operation that applies voltages to each of the drain and source of the MOS transistor included in each memory cell of the setting information storage region, a voltage difference between the voltage applied to the drain and the voltage applied to the source being larger than a predetermined voltage differences.

8. The semiconductor nonvolatile memory device according to claim 5, wherein, when the output circuit reads the setting information stored in the setting information storage region, the output circuit reads at a timing slower than a predetermined reading timing.

9. The semiconductor nonvolatile memory device according to claim 5, wherein the output circuit outputs the setting information selected from the plurality of sets of setting information to the reference current circuit such that the current value of the reference current increases when a number of reuses of the memory array portion increases.

10. A semiconductor nonvolatile memory device comprising:

a memory array portion in which nonvolatile memory cells are plurally arranged;

an output circuit that outputs setting information selected from a plurality of sets of setting information to generate reference currents with different current values for a time of first use or a time from second use;

a reference current circuit that generates a reference current with a current value according to the setting information outputted from the output circuit; and an amplifier circuit that compares a cell current outputted from a selected memory cell of the memory array portion with the reference current generated by the reference current circuit;

wherein the plurality of sets of setting information are stored in a predetermined plurality of setting information storage regions of the memory array portion, and selection data for selecting any of the setting information storage regions is stored in a predetermined selection data storage region of the memory array portion, the selection data indicating the time of first use or the time from second use, and when a power source is turned on, the output circuit reads and latches the setting information stored in the setting information storage region that is selected by the selection data stored in the selection data storage region, and outputs the latched setting information to the reference current circuit.

11. The semiconductor nonvolatile memory device according to claim 10, wherein each of the plurality of memory cells arranged in the memory array portion is provided with a plurality of charge accumulation portions, and the selection data is stored using a charge accumulation portion of the plurality of charge accumulation portions of each memory cell arranged in the selection data storage region, and the setting information is stored using a charge accumulation portion of the plurality of charge accumulation portions of each memory cell arranged in the setting information storage regions.

12. The semiconductor nonvolatile memory device according to claim 10, further comprising an application unit that, when the output circuit reads the selection data stored in the selection data storage region and the setting information stored in the setting information storage region, performs at least one of a first application operation that applies a voltage to the gate of a MOS transistor included in each memory cell of the selection data storage region and the setting information storage region, which voltage is larger than a magnitude of a predetermined voltage for reading, or a second application operation that applies voltages to each of the drain and source of the MOS transistor included in each memory cell of the selection data storage region and the setting information storage region, a voltage difference between the voltage applied to the drain and the voltage applied to the source being larger than a predetermined voltage difference.

13. The semiconductor nonvolatile memory device according to claim 10, wherein, when the output circuit reads the selection data stored in the selection data storage region and the setting information stored in the setting information storage region, the output circuit reads at a timing slower than a predetermined reading timing.

14. The semiconductor nonvolatile memory device according to claim 10, wherein the output circuit outputs the setting information selected from the plurality of sets of setting information to the reference current circuit such that the current value of the reference current increases when a number of reuses of the memory array portion increases.

* * * * *